United States Patent
Willing et al.

(10) Patent No.: US 6,727,113 B2
(45) Date of Patent: Apr. 27, 2004

(54) METHOD FOR MAKING PYROELECTRIC SENSORS COMPRISING A THIN PYROELECTRIC FILM REQUIRING AN ELECTRIC POLARIZATION

(75) Inventors: Bert Willing, Belmont (CH); Paul Muralt, La Sarraz (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 10/333,456
(22) PCT Filed: Jul. 6, 2001
(86) PCT No.: PCT/EP01/07836
§ 371 (c)(1),
(2), (4) Date: Jan. 22, 2003
(87) PCT Pub. No.: WO02/13283
PCT Pub. Date: Feb. 14, 2002

(65) Prior Publication Data
US 2003/0176004 A1 Sep. 18, 2003

(30) Foreign Application Priority Data
Aug. 4, 2000 (EP) .............................................. 00116868

(51) Int. Cl.[7] .............................................. H01L 21/00
(52) U.S. Cl. ........................................ 438/54; 438/384
(58) Field of Search .............................. 438/48, 50, 54, 438/381, 382, 384

(56) References Cited
U.S. PATENT DOCUMENTS 5,288,649 A * 2/1994 Keenan ...................... 438/384
5,602,043 A * 2/1997 Beratan et al. ................ 438/54
5,627,082 A * 5/1997 Beratan et al. ................ 438/55
6,020,216 A * 2/2000 Beratan et al. ................ 438/54

FOREIGN PATENT DOCUMENTS

EP    0 491 596 A1    6/1992

OTHER PUBLICATIONS

Patent Abstracts of Japan, vol. 18, No. 064, (P–1685), Feb. 2, 1994 & JP 05 281034 (Horiba Ltd.).

* cited by examiner

Primary Examiner—Chandra Chaudhari
(74) Attorney, Agent, or Firm—Sughrue Mion, PLLC

(57) ABSTRACT

Method for manufacturing a plurality of pyroelectric sensors by forming a thin pyroelectric film or layer on one face of a silicon wafer or substrate, wherein electric polarization of this film is provided between lower and upper electrodes defining pixels forming these sensors. In order to protect the wafer in the event of a short-circuit between two electrodes of a pixel, resistors are arranged in series with the lower or upper electrodes by connecting these electrodes to each other by subsets in order to carry out the electric polarization. Once this polarization has been carried out, the electric connections connecting the upper or lower electrodes are removed to allow each pixel to supply an elementary electric signal when the sensor is operating. In order to minimize the risk of short-circuits and in order to reduce the stray capacity of the electrodes, the upper and lower electrodes of the pixels are structured. In the case of intersections of the connecting paths in projection onto the general plane of the wafer, these intersections are preferably provided between the electrodes and the respective resistors.

10 Claims, 2 Drawing Sheets

METHOD FOR MAKING PYROELECTRIC SENSORS COMPRISING A THIN PYROELECTRIC FILM REQUIRING AN ELECTRIC POLARIZATION

BACKGROUND OF THE INVENTION

The present invention concerns a method for manufacturing pyroelectric sensors by forming a thin pyroelectric film or layer on one face of the same wafer or substrate, particularly made of silicon. Each sensor is formed of several pixels each defined by a first electrode of its own located on one face of the pyroelectric film and a second electrode located on the other face of said film.

Such pyroelectric sensors have several uses, particularly for gas spectrometry and thermal imagining. They are relatively inexpensive. However, for the pyroelectric film to work properly, it is generally necessary for it to undergo electric polarisation, i.e. the application of an electric field between two electrodes which has the effect of orienting the dipoles of the pyroelectric film at least between the first and second electrodes of the pixels. By way of example, an electric field of approximately 30 V is applied across the first and second electrodes of the pixels with a temperature of the pyroelectric film of between 110 and 170° C., for approximately 10 minutes. A plurality of sensors is batch manufactured with technology similar to that for the manufacture of integrated circuits. A silicon wafer of a diameter of 10 cm can contain several hundred sensors formed either of linear networks of pixels or two-dimensional networks in the form of pixel matrices.

A method for manufacturing such sensors has to allow at least pixel subsets to be polarised simultaneously; pixel-by-pixel polarisation having to be set aside for obvious reasons. Preferably, all the pixels of the same wafer are polarised simultaneously so as to reduce the manufacturing costs and the manufacturing time of the sensors. In order to polarise at least a pixel subset, on the one hand their upper electrodes and on the other hand their lower electrodes are electrically connected to each other. Generally, either the upper electrodes, or the lower electrodes are electrically connected to each other permanently so as to be set at a common potential during operation of the sensor. However, the other electrodes have to be electrically insulated from each other so as to provide elementary electric signals.

In general, those skilled in the art provide for the lower electrodes to be formed by a metallic film defining a common electrode for all the pixels. This allows manufacturing steps to be saved. Thus, the silicon wafer has a continuous metal film on which the thin pyroelectric film is deposited. The upper electrodes, which geometrically define the pixels, are deposited on this film.

In the aforementioned example, the upper electrodes of the sensor have to be insulated from each other prior to its use, as mentioned hereinbefore. However, in order to simultaneously polarise at least a pixel subset, temporary electric connections are formed between the upper electrodes. In other words, in order to carry out the polarisation the electrodes provided to supply the elementary electric pixel signals are also electrically connected. Thus, preferably, all these electrodes will be connected at least by subsets connected to at least one electric contact pad provided to carry out the polarisation.

However, such a method has a major drawback given that any accidental short-circuit between the electrodes of a pixel will cause a voltage drop for all the pixels of the subset concerned. Electric polarisation thus becomes impossible and a whole wafer may be wasted. Given the number of sensors manufactured on the same wafer, such an event causes considerable losses, which significantly increases the cost price of such sensors in industrial production.

SUMMARY OF THE INVENTION

The object of the present invention is to overcome the aforementioned drawback while allowing simultaneous electric polarisation for at least pixel subsets of a sensor wafer being manufactured.

This object is achieved by the subject of the invention as defined in claim 1 which concerns a method for manufacturing a plurality of pyroelectric sensors wherein there is provided a step where electric connections are formed between at least a subset of first electrodes each forming an electrode belonging to a pixel and wherein electric resistors are formed, arranged such that each electrode of said subset is series connected with one of said resistors.

As a result of the arrangement of the aforementioned electric resistors, a short-circuit at one pixel no longer causes a critical drop in the polarisation voltage applied during a polarisation step following the aforementioned step. Thus, it is possible to polarise the sensors of a wafer properly even in the presence of one or several short-circuits at certain pixels. The short-circuited pixels are of course inoperative in the operation of the manufactured sensors, but this problem remains localised only at the pixel that has been accidentally short-circuited.

So as to further reduce the risk of short-circuits and deterioration of the sensors, within the scope of the invention and according to a preferred embodiment, it is provided to also structure the electrodes intended to be connected to each other to a reference potential. Thus, the pixels are defined by lower and upper electrodes belonging to the pixels. This allows stray capacities formed by the electrodes to be reduced. These second electrodes are connected at least partially to each other by second electric connections, i.e. they are electrically connected at least by subsets preferably corresponding to the previously mentioned subsets.

According to sensor manufacturing variant, the first and second electric connections respectively connecting upper and lower electrodes intersect in projection onto the general plane of the wafer. To prevent any short-circuit between these first and second electric connections at the intersections causing deterioration of part of the sensors or all of them by a polarisation voltage drop, the first and second connections are arranged such that the intersections are located between the resistors and the electrodes to which they are connected.

According to a particularly advantageous embodiment, well suited for the linear pixel networks or for matrices with two lines of pixels, the connections between the electrodes associated with the protective resistors are automatically broken when the sensors are diced.

BRIEF DESCRIPTION OF THE DRAWINGS

Other embodiments and variants for implementing the method according to the invention, in addition to particular advantages of the invention will be described hereinafter using the following description, made with reference to the annexed drawing given by way of non-limiting example and in which.

DETAILED DESCRIPTION OF THE PREFERRED EMBODIMENTS

Figure 1:
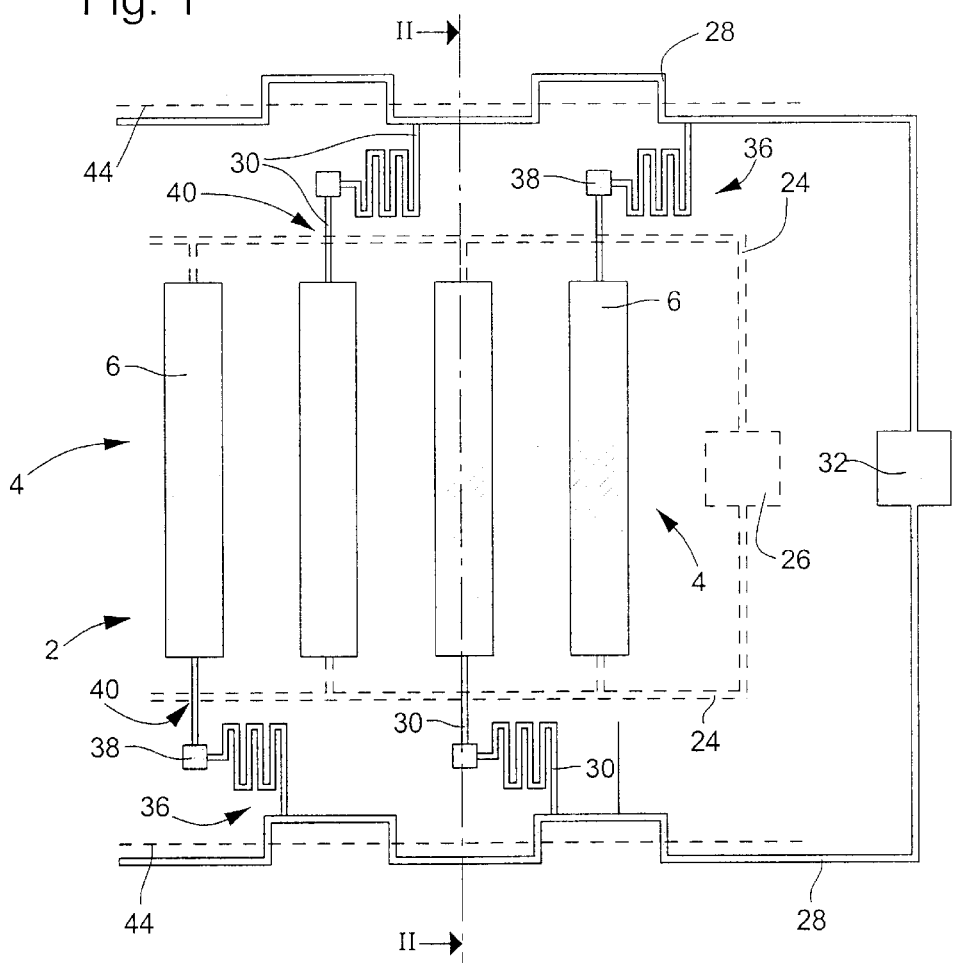
FIG. 1 shows partially and schematically a top view of a pyroelectric sensor wafer being manufactured in accordance with a first implementation mode of the method according to the invention.
Figure 2:
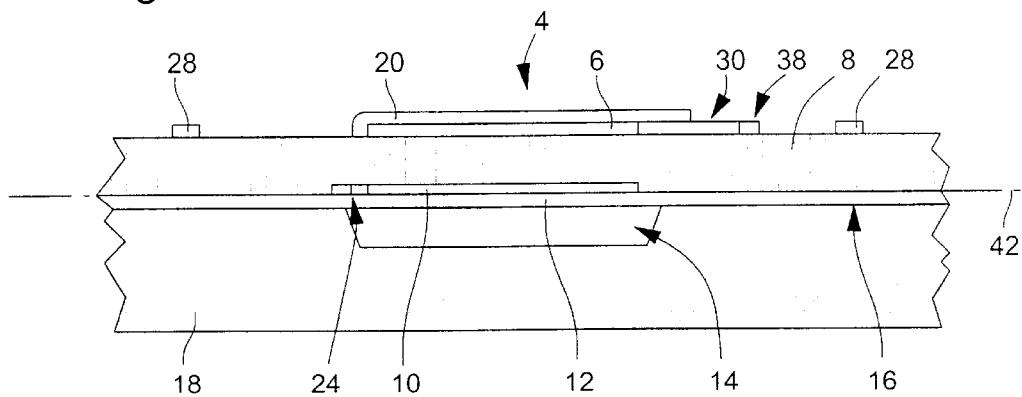
FIG. 2 is a cross-section along the line II—II of FIG. 1.

A first implementation mode of the manufacturing method according to the invention will be described hereinafter with reference to FIGS. 1 and 2. FIG. 1 partially shows a sensor 2 formed of a linear pixel network 4. Each pixel is defined by the geometry of an upper electrode 6 which belongs thereto. Each of these pixels is formed of a thin pyroelectric film 8 on the upper face of which is formed electrode 6 and on the lower face of which is provided a lower electrode 10 formed on a membrane 12. Under membrane 12, formed particularly of $SiO_2$ and/or $Si_3N_4$, there is provided a cavity 14 for thermally insulating each pixel.

The sensors are formed on an upper face 16 of a silicon wafer 18. Thousands of pyroelectric sensors can be manufactured on this wafer. During manufacture of such sensors, it is possible to provide a lower electrode common to all the pixels of a sensor, or even common to all the sensors and forming a continuous metallic film on the wafer. Likewise, pyroelectric film 8 can be common to the pixels of one sensor, or to all the sensors of the same wafer. However, for the purpose of thermally insulating the pixels from each other, film 8 is generally at least partially structured. In the case of FIG. 1, film 8 will be removed particularly in the regions located between electrodes 6. Finally, an absorption film 20, for example of black platinum (not shown in FIG. 1) is deposited on the upper electrodes.

In order to polarise film 8 electrically between electrodes 6 and 10 of each pixel, lower electrodes 10 and connected to each other by electric connections 24 ending in at least one electric contact pad 26. Likewise, the upper electrodes are electrically connected to each other by temporary electric connections formed of main paths 28 and secondary paths 30 connecting each electrode 6 to a main path. These electric connections are thus formed in accordance with the method of the invention to allow at least one pixel subset to be simultaneously polarised. In order to do this, main paths 28 are connected to at least one electric contact pad 32. It will be noted that for one wafer, generally several contact pads 26 and/or 32 are provided each connecting a subset of lower electrodes and/or upper electrodes of the sensors being manufactured.

According to the invention, a resistor 36 is formed for each pixel 4, series connected with the upper or lower electrode of said pixel. In the example described here, resistors 36 are series connected with electrodes 6 and located along secondary paths 30. The electric connections of electrodes 6 to pad 32 are provided firstly to allow an electric polarisation step of pyroelectric film 8 to be carried out by applying a voltage between the lower and upper electrodes, via contact pads 26 and 32. Secondly, they are provided for the deposition of absorption film 20 by an electrochemical process. By way of example, resistor 36 has a value of the order of 10 kΩ.

As was already mentioned in the introductory part of the present description, resistor 36 is used firstly to protect the sensor wafer being manufactured during the electric polarisation step. Indeed, if a short-circuit occurs in a pixel between electrodes 4 and 6, resistor 36 greatly limits the stray current and prevents the polarisation voltage dropping; which would otherwise cause the loss of at least a part of the wafer and thus thousands of sensors. Those skilled in the art will be able to select the range of suitable values for resistor 36. Secondly, these resistors 36 are used to define a substantially equal impedance for each upper electrode 6, which is advantageous for allowing deposition of absorption film 20 in a uniform manner over all of the upper electrodes.

An individual contact pad 38 is provided for each pixel, arranged between the upper electrode and the resistor.

In order to reduce the risk of short-circuits between the lower and upper metallisations with respect to film 8, in the case of the present invention lower electrode 10 is also structured and these electrodes are connected by connecting paths 24. For the purpose of protecting the plurality of sensors in the event of a short-circuit between the lower and upper electric connections, the intersections of these connections in projection onto the general plane 42 of the wafer preferably occur between electrodes 6 and the respective resistors 38. Thus, if an accidental short-circuit occurs between connections 24 and 30, resistors 36 protect the rest of the pixels and in particular the sensors not concerned by this localised deterioration.

Main paths 28 are castellated and, when a sensor is separated from the wafer, said wafer is diced along dotted lines 44. Thus, during dicing, the electric connections between the upper electrodes are automatically cut such that these electrodes are then electrically insulated from each other. Pads 38 are used to receive elementary pixel signals and it will be noted that resistor 36 is located on the other side of electrode 6 relative to pad 38 such that it is inactive when the sensor operates.

It will be noted that resistors 36 are made here in thin essentially horizontal film(s) and are located on the side of upper face 16 of wafer 18. These resistors can be arranged in one or several layers in accordance with known techniques.

In the case of sensors arranged in a matrix formed of two lines of pixels, it is possible to arrange the various elements in a similar manner to FIG. 1, each of the lines of pixels having its resistors arranged on the side opposite to the other line, whereas in FIG. 1, the resistors are arranged alternately on one side of the pixels and the other. In the case of a pixel matrix having more than two lines, it is possible to provide temporary electric connections partially arranged between the pixels, particularly to reach the non-peripheral pixels. In order to save space and keep a high pixel density per surface unit, it is possible for large pixel matrices to arrange these electric connections in a multilayered structure where different metallisation levels are insulated from each other in accordance with known metallisation techniques from the semiconductor field. Such an embodiment ensures micro-machining only on the side of upper face 16 of wafer 18. However, the manufacturing steps are increased and the thermal insulation of the pixels can be reduced if the electric connections and their insulating layers are not removed between the pixels. An advantageous solution for the electric connections necessary for polarisation of relatively spread two-dimensional sensors is given hereinafter.

Figure 3:
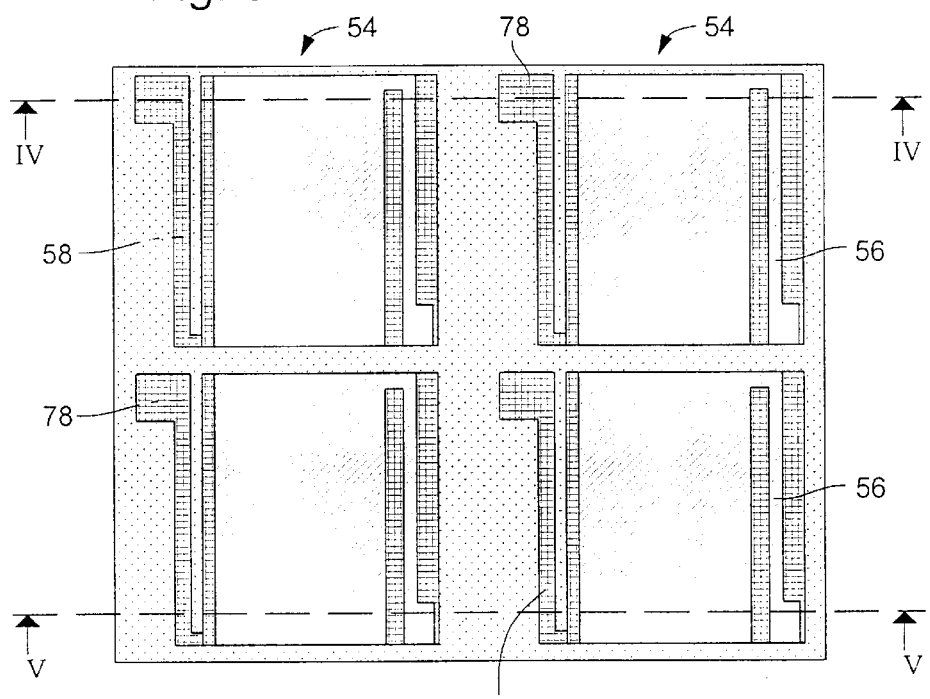
FIG. 3 is a partial schematic top view of a pyroelectric sensor wafer being manufactured in accordance with a second implementation mode of the method according to the invention.
Figure 4:
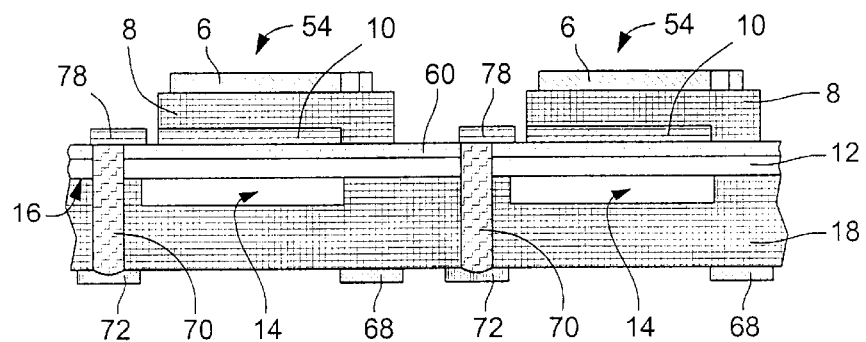
FIGS. 4 and 5 are cross-sections respectively along the lines IV—IV and V—V of FIG. 3.
Figure 5:
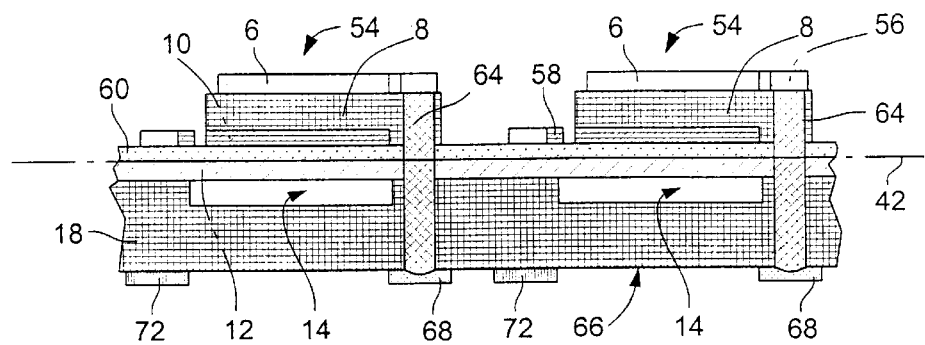

With reference to FIGS. 3 and 4, a second implementation mode of the method according to the invention will be described hereinafter. FIG. 3 shows partially an arrangement of pixels in matrix form. Only 4 pixels 54 are shown; but a sensor can be formed of a matrix having several pixel lines and columns. The method described here can be applied to sensors formed of a large number of pixels. The references already described previously will not be described again here.

Pixels 54 are formed of lower 6 and upper 10 electrodes located on each side of a structured pyroelectric film 8. In order to protect film 12 during micromachining of electrode 10 and its connection arm 58 by dry etching, a buffer layer or barrier layer 60 is provided above film 12. Layer 60 is relatively thick and also forms a barrier preventing interdiffusions between the pyroelectric film and membrane 12. Moreover, it acts as an adhesion layer for the lower electrode. It can be formed particularly of $ZrO_2$, $TiO_2$ or other similar oxides, resistant to oxidation and to reactions with the pyroelectric film.

The electric connections between the upper electrodes are achieved by means of conductive vias connecting connection arms 56 arranged on film 8 to paths 68 arranged on lower face 66 of wafer 18. The connections between the upper electrodes are thus achieved from underneath wafer or sensor concerned. Likewise, lower electrodes 10 are electrically connected to each other by means of vias 70 vertically connecting arms 58 to conductive paths 72 located on rear face 66 of wafer 18. Paths 68 and 72 are rectilinear and pass through wafer 18 to connect upper and lower electrode rows. They have an electric contact pad at at least one end. The arrangement described hereinbefore allows simultaneous polarisation of all of the pixels arranged on wafer 18 to be carried out.

According to the invention, vias 64 or 70 form protective resistors for the wafer being manufactured during electric polarisation of the pixels. In the example given here, it is vias 70 which form the electric protective resistors. After the polarisation step, the electric connections between the lower electrodes are preferably removed by removing paths 72 by a wet etching or dry etching step, by chemical mechanical polishing (CMP) or by laser cutting. However, it may be advantageous to keep paths 68 so as to be able to set the upper electrodes of a sensor at a same electric potential. In order to collect the elementary electric pixel signals, contact pads 78 are provided, located between electrode 10 and resistor 70. However, it is also possible to provide these pads 78 on the back face 66 of the wafer, for example at the ends of vias 70 opening onto said back face. The use of vias thus allows the problem of space requirement linked to the necessary electric connections to be resolved, and allows the protective resistors to be advantageously arranged at the vias.

Those skilled in the art may also devise other variants without departing from the scope of the present invention. In particular, it is possible to provide electric connections from the back face of the wafer for the lower electrodes, but to provide electric connections for the upper electrodes on the side of front face 16, i.e. above layer 60 and in particular above the pyroelectric film, as explained in the first implementation of the invention. In such a mixed embodiment, the resistors can be arranged either at the vias or at the metallisation level of the upper electrodes.

It will also be noted that electric resistors can be arranged on back face 66 of the wafer.

What is claimed is:

1. A method for manufacturing a plurality of pyroelectric sensors by forming a thin pyroelectric film on one face of the same wafer, particularly made of silicon, defining a general plane, each sensor being formed of several pixels each defined by a first electrode of its own located on one face of said pyroelectric film and a second electrode located on the other face of said film, wherein at least the following successive steps are provided:

A) forming first electric connections between at least a subset of first electrodes of said plurality of sensors connecting these first electrodes to at least one electric contact pad and forming electric resistors arranged such that each first electrode of said at least one subset is series connected with one of these resistors;

B) electrically polarising said pyroelectric film between the first and second electrodes by applying an electric voltage across said at least one electric contact pad and said second electrodes of the pixels corresponding to said at least one subset of first electrodes;

C) electrically insulating said first and/or second electrodes of at least one sensor from each other.

2. A method according to claim 1, wherein said second electrodes of the pixels are also formed by electrodes of their own that are located respectively facing said first electrodes and connected at least partially to each other by second electric connections.

3. A method according to claim 2, wherein said first and second electric connections intersect in projection onto the general plane of said wafer, said second connections being arranged such that these intersections occur between said first electrodes and said respective resistors.

4. A method according to claim 1, wherein said first connections of a same sensor are arranged such that they are cut when the sensor is diced and such that its first electrodes are then electrically insulated from each other.

5. A method according to claim 1, wherein said resistors and said first electric connections are arranged in thin essentially horizontal film(s) on the side of the upper face of said wafer.

6. A method according to claim 1, wherein said first electric connections are formed at least partially of paths located on the lower face of said wafer and of vias passing through the wafer.

7. A method according to claim 6, wherein said resistors are all arranged at least partially at said vias.

8. A method according to claim 6, wherein said sensors are each formed of a two-dimensional pixel matrix.

9. A method according to claim 1, wherein electric contact pads for connecting said first electrodes are formed between the latter and the respective resistors and that, during said step C, said first electrodes are insulated from each other.

10. A method according to claim 1, wherein the values of said resistors are provided to be substantially equal, to define a substantially equal impedance of the pixels, allowing an absorption layer to be uniformly deposited on these pixels by an electrochemical method.

* * * * *